United States Patent
Jensen et al.

(10) Patent No.: US 9,899,964 B2
(45) Date of Patent: Feb. 20, 2018

(54) CLASS AB AMPLIFIER WITH BIAS CONTROL

(71) Applicant: Bang & Olufsen A/S, Struer (DK)

(72) Inventors: Jørgen Selmer Jensen, Hjerm (DK); Jens Nørmølle Rasmussen, Struer (DK)

(73) Assignee: BANG & OLUFSEN A/S, Struer (DK)

( * ) Notice: Subject to any disclaimer, the term of this patent is extended or adjusted under 35 U.S.C. 154(b) by 0 days.

(21) Appl. No.: 15/312,342

(22) PCT Filed: Jun. 30, 2015

(86) PCT No.: PCT/EP2015/064809
§ 371 (c)(1),
(2) Date: Nov. 18, 2016

(87) PCT Pub. No.: WO2016/001207
PCT Pub. Date: Jan. 7, 2016

(65) Prior Publication Data
US 2017/0085230 A1    Mar. 23, 2017

(30) Foreign Application Priority Data

Jul. 3, 2014   (EP) .................................... 14175513

(51) Int. Cl.
*H03F 1/30*   (2006.01)
*H03F 3/30*   (2006.01)
(Continued)

(52) U.S. Cl.
CPC ............ *H03F 1/302* (2013.01); *H03F 1/307* (2013.01); *H03F 1/308* (2013.01); *H03F 1/32* (2013.01); *H03F 3/183* (2013.01); *H03F 3/21* (2013.01); *H03F 3/3016* (2013.01); *H03F 3/3066* (2013.01); *H03F 3/45174* (2013.01); *H03F 2200/321* (2013.01); *H03F 2200/462* (2013.01);
(Continued)

(58) Field of Classification Search
CPC ...................................................... H03F 1/302

USPC ....................................................... 330/290
See application file for complete search history.

(56) References Cited

U.S. PATENT DOCUMENTS 3,995,228 A * 11/1976 Pass ...................... H03F 3/3074
                                                              330/255
4,077,013 A    2/1978 Morez et al.
(Continued)

FOREIGN PATENT DOCUMENTS

EP          2645565         10/2013
WO    WO 2016/001207        1/2016

OTHER PUBLICATIONS

Error correction and Non-Switching Power Amplifier Output Stages, by Hawksford, presented at 102$^{nd}$ AES Convention, Mar. 22-25, 1997, 23 pages.

(Continued)

*Primary Examiner* — Patricia T Nguyen
(74) *Attorney, Agent, or Firm* — Harness, Dickey & Pierce, P.L.C.

(57) ABSTRACT

An amplifier arrangement comprising first and second power amplifiers (T1, T2) having drains connected to positive and negative drive voltages, respectively, and gates connected to an input signal. The arrangement further comprises first and second current sensors (1, 2) for detecting first and second drain currents from the power amplifiers, processing circuitry (3) adapted to identify the smallest drain current, and a feedback control loop (5) and means for driving a bias current dependent on a feedback signal through a resistor connected between the input signal and the gate of an inactive one of the first and second power amplifiers. The control loop will keep the idle current constant in the transistor with the lowest current (the inactive transistor). Thereby, the current running in the transistor which does not deliver current to the load will be fixed at a desired value.

6 Claims, 4 Drawing Sheets

(51) Int. Cl.
*H03F 1/32* (2006.01)
*H03F 3/183* (2006.01)
*H03F 3/21* (2006.01)
*H03F 3/45* (2006.01)

(52) U.S. Cl.
CPC . *H03F 2200/78* (2013.01); *H03F 2203/30024* (2013.01); *H03F 2203/30078* (2013.01); *H03F 2203/30111* (2013.01)

(56) References Cited

U.S. PATENT DOCUMENTS

| | | | |
|---|---|---|---|
| 4,160,216 A | | 7/1979 | Thornton |
| 4,356,452 A | * | 10/1982 | Iwamatsu ............. H03F 3/3077 330/265 |
| 4,595,883 A | | 6/1986 | Nakayama |
| 5,467,058 A | | 11/1995 | Fujita |
| 8,497,736 B1 | * | 7/2013 | Leipold .................... H03F 3/19 330/267 |
| 9,071,201 B2 | * | 6/2015 | Jones .................... H03F 1/0205 |
| 2011/0043278 A1 | * | 2/2011 | Adams .................... H03F 1/307 330/69 |
| 2014/0155126 A1 | | 6/2014 | Schelmbauer et al. |

OTHER PUBLICATIONS

Seevink et al: "A Low-Distortion Output Stage with Improved Stability for Monolithic Power Amplifiers", IEEE Journal of Solid-State Circuits, vol. 23, No. 3, Jun. 1, 1988, pp. 794-801.

* cited by examiner

US 9,899,964 B2

CLASS AB AMPLIFIER WITH BIAS CONTROL

FIELD OF THE INVENTION

The present invention relates to an auto bias class AB amplifier.

BACKGROUND OF THE INVENTION

In a Class AB amplifier the standing current through both transistors when there is no signal is referred to as idle current. The idle current decreases distortion in the crossover region (the switch from one amplifier to the other). But the drawback is that it at the same time increases power consumption in the idle state. Another drawback is that the bias current applied to set the idle current has to be adjusted to the temperature.

Various attempts have been made to improve idle power consumption, without sacrificing high fidelity. For example, U.S. Pat. No. 4,077,013 discloses a system where the bias current is adjusted (down) when there is no input.

An attempt to overcome these problems is presented in the article: "Error correction and Non-Switching Power Amplifier Output Stages, by Hawksford, presented at the $102^{nd}$ AES Convention, Mar. 22-25, 1997. With this approach, a high degree of linearity is achieved by current driving the output transistors and using a specific type of output transistors. However, as soon as the output leaves the class A condition the current in the branch not supplying current will turn off completely, i.e. running in pure class B operation.

Attempts have been made to actively monitor and control the bias current of each power transistor, for example U.S. Pat. No. 3,995,228 and U.S. Pat. No. 4,160,216 where the current is monitored by measuring the voltage across the emitter resistance, which causes problems especially when the idle current is small.

A solution is presented in U.S. Pat. No. 4,595,883. In this solution, the transistor which does not provide output will still remain active. This is achieved by a control loop that is misbalanced by the parasitic voltage dependent current of a transistor to keep an idle current running. However, this solution is not robust. The voltage dependent current which is referred to as the "Early voltage" is parasitic and normally a parameter with huge tolerances. The control circuit with local feedback of the audio signal further means that the audio signal has to pass several transistors before entering the output transistors. This feedback loop establishes a low impedance output at the emitters of the transistors. At this point there are two emitter resistors to measure the idle current. In order to have enough voltage across these transistors the emitter resistors have to be in the range of one Ohm, and the output stage would thus essentially have an output impedance of one Ohm. In a good amplifier, the output impedance must be at least 100 times lower. This can only be achieved by an external feedback control, in which case the one Ohm output resistor in combination with a reactive load may cause a phase shift and oscillation.

General Disclosure of the Invention

The object of the present invention is to provide an alternative solution to prior art solutions, providing a Class AB amplifier with controlled bias exhibiting low distortion and improved linearity.

According to the present invention, this and other objects are achieved by a method for controlling an idle current in an amplifier arrangement having a first and a second power amplifier, a positive voltage connected to a drain of the first power amplifier, a negative voltage connected to a drain of the second power amplifier, and an input signal connected to a gate of each power amplifiers, and wherein a source of the first power amplifier and a source of the second power amplifier are both connected to a load. The method comprises detecting a first drain current from the first power amplifier, detecting a second drain current from the second power amplifier, identifying an idle current as the smallest drain current of the first and second drain currents, comparing the idle current with a pre-set idle current set point, to provide an error signal, supplying the error signal to a bias control loop, to provide a feedback signal, driving a bias current proportional to the feedback signal through a resistor connected between the input signal and the gate of an inactive one of the first and second power amplifiers, the feedback signal thereby controlling a bias voltage on the gate to ensure that a drain current from the inactive power amplifier is equal to the pre-set idle current.

The objects are also obtained by an amplifier arrangement comprising a first power amplifier having a drain connected to a positive drive voltage and a gate connected to an input signal, a second power amplifier having a drain connected to a negative drive voltage and a gate connected to the input signal, wherein a source of the first power amplifier and a source of the second power amplifier are both connected to a load, a first current sensor detecting a first drain current from the first power amplifier, a second current sensor detecting a second drain current from the second power amplifier, processing circuitry adapted to identify an idle current as the smallest drain current of the first and second drain currents, a comparator for comparing the idle current with a pre-set idle current set point, to provide an error signal, a bias control loop providing a feedback signal based on the error signal, and means for driving a bias current dependent on the feedback signal through a resistor connected between the input signal and the gate of an inactive one of the first and second power amplifiers, so as to ensure that a drain current from the inactive power amplifier is equal to the pre-set idle current.

According to the invention a bias control loop will keep the idle current constant in the transistor with the lowest current (the inactive transistor). Thereby, the current running in the transistor which does not deliver current to the load will be fixed at a desired value. The value is fixed for all operation and signal conditions that might appear, and independent of the values of $V_{in}$, $V_{out}$, output current or a possible inductive load.

According to the invention, audio performance can be maintained with a lower idle current, thus leading to significant reductions in power consumption when idling. Alternatively, improved audio performance can be achieved without increasing the idle current.

Compared to a conventional class AB amplifier, the inactive transistor is still active, why an amplifier according to the present invention may be referred to as a "class ABA" amplifier.

It is noted that the expression "drain" implies that the transistors are MOS transistors. However, the present invention may also be implemented using bipolar transistors, in which case the collector current is detected, and the bias voltage is applied to the base.

The processing circuitry may be implemented by analogue circuitry or using a digital processor with suitable sampling.

According to a preferred embodiment, the bias current is applied to both transistors. This has a linearizing effect on the amplifier, and it can be shown that the non-linear component is reduced by 50%.

BRIEF DESCRIPTION OF THE DRAWINGS

The present invention will be described in more detail with reference to the appended drawings, showing currently preferred embodiments of the invention.

DETAILED DESCRIPTION OF CURRENTLY PREFERRED EMBODIMENTS

Figure 1:
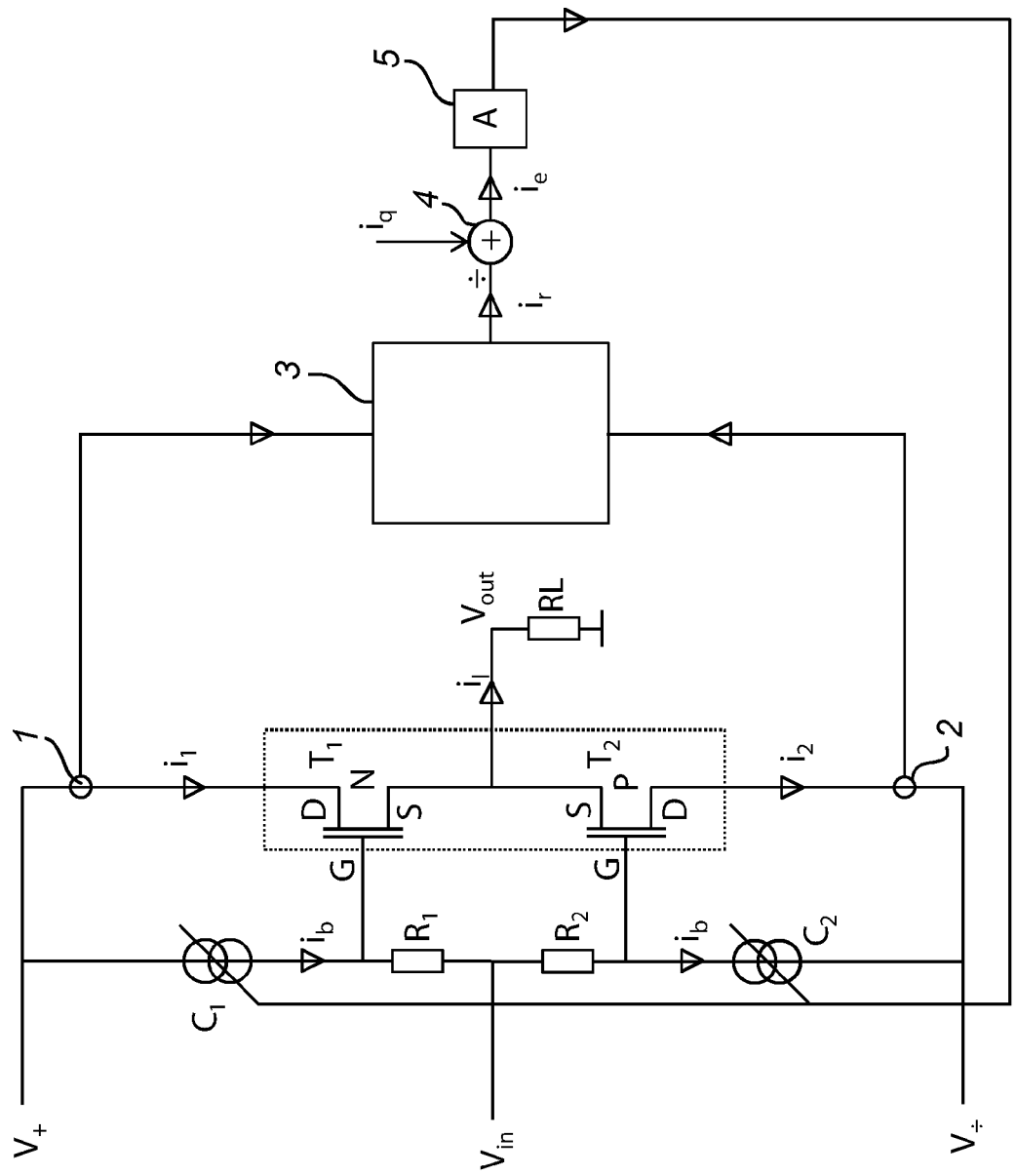
FIG. 1 is a schematic block diagram of an amplifier according to an embodiment of the invention.

FIG. 1 shows an amplifier arrangement according to an embodiment of the invention with two MOSFET transistors; a top transistor T1 and a bottom transistor T2, delivering voltage $V_{out}$ to a load RL. The top transistor T1 is connected to a positive drive voltage, and its gate is connected to an input voltage via a resistor R1. The bottom transistor T2 is connected to a negative drive voltage, and its gate is connected to an input voltage via a resistor R2. The drain current in the top transistor T1 is referred to as $i_1$ and the drain current in the bottom transistor T2 is referred to as $i_2$. The drain of each transistor is connected to respective current sensors 1, 2, arranged to detect the two drain currents $i_1$, $i_2$.

The arrangement further comprises processing circuitry arranged to rectify the signals from the current sensors 1, 2, and to identify the smallest current of $i_1$ and $i_2$. This smallest current, i represents the idle current running in the branch which does not deliver current to the output load RL. A bias control loop includes a comparator 4, arranged to compare the value of the smallest current $i_r$ with a value representing a desired idle current, $i_q$. The control loop further comprises a loop gain 5 connected to two current sources C1 and C2. The current sources are respectively connected to resistors R1 and R2.

Figure 2:
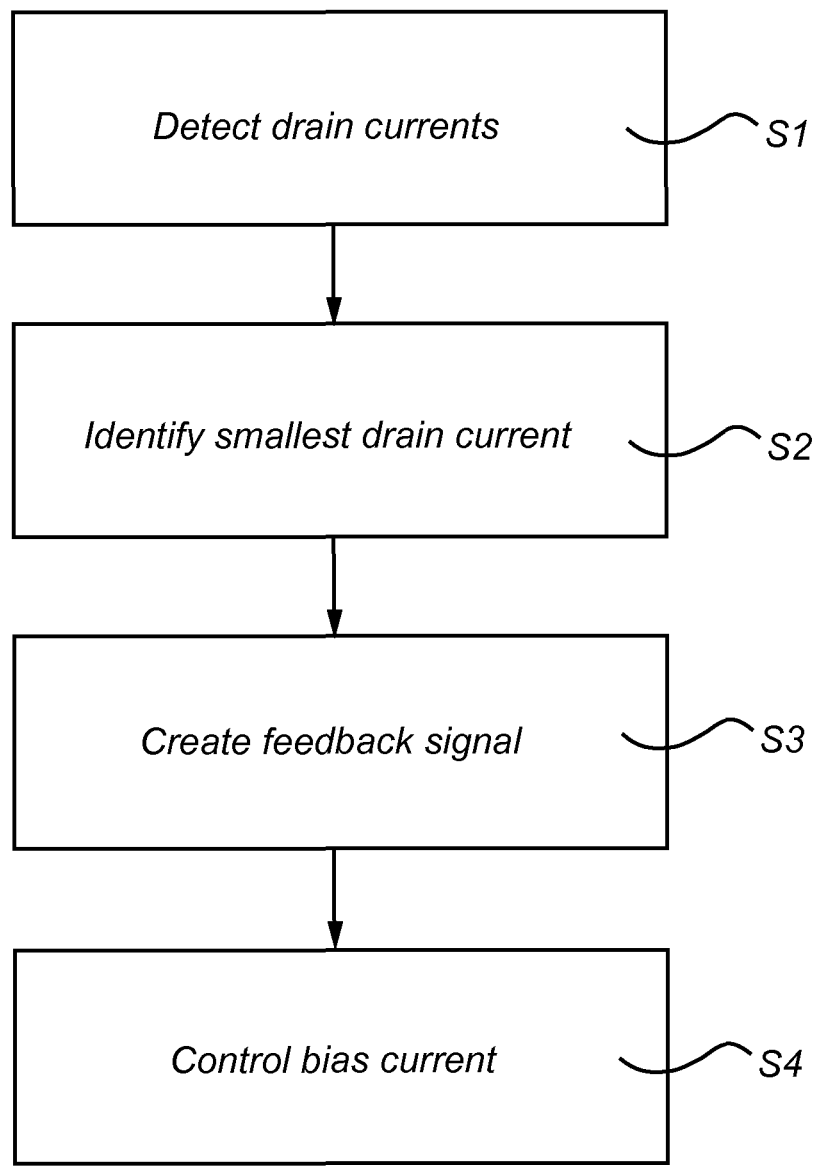
FIG. 2 is a flow chart of a method according to an embodiment of the invention.

The operation of the arrangement in FIG. 1 will now be briefly described with reference to FIG. 2. First, in step S1, the two drain currents $i_1$, $i_2$ are detected by the current sensors 1, 2, and signals representing the detected currents are supplied to the processing circuitry 3. In step S2, the smallest current of $i_1$ and $i_2$ is identified by the processing circuitry 3. In step S3, a feedback signal is formed by comparing the identified smallest current, ir, with the desired idle current, and amplifying the resulting error $i_e$ by a constant gain A in the loop gain 5. In step S4, the feedback signal is used to control the current sources C1 and C2 to draw a bias current through resistors R1 and R2, thereby influencing a bias voltage across the resistors R1, R2. The drain current feedback acts as a bias control loop, and ensures that if the smallest drain current of $i_1$ or $i_2$ is less than $i_q$, the current through R1/R2 will increase until this smallest current becomes equal to $i_q$. This ensures a constant idle current equal to $i_q$ through T1 and T2 when they are inactive.

In addition, the feedback described above provides a linearizing effect as will be described in the following.

FIG. 1 can be seen as a unity gain voltage follower. The relation ideally is $V_{out}=V_{in}$. The relation between drain current and gate source voltage, on the other hand, is non-linear.

If T1 and T2 are perfectly matched, then the gate source voltage $V_{GS1}=V_{GS2}$ for the same drain current and the same drain-source voltage. For simplicity, R1 is assumed to be equal to R2. Under these conditions, the following holds:

$$V_{out}=V_{in}+i_b*R1-V_{GS1} \qquad 1.$$

$$V_{out}=V_{in}-i_b*R1+V_{GS2} V_{out}=*V_{in}-i_b*R1+V_{SG2}, \qquad 2.$$

where $V_{in}$ is the input signal, $V_{out}$ is the output voltage, $i_b*R1$ is the bias voltage and $V_{GSx}$ is the gate-source voltage. If $V_{in}=0$ then $V_{out}=0$ and $V_{GS}=V_{GS1}=V_Q=i_{bq}*R1$, where $i_{bq}$ is the bias current through R1. In a conventional bias system the voltage difference between $V_{G1}$ and $V_{G2}$ is held constant. In FIG. 1 this would correspond to breaking the control loop and consider the bias current $i_b$ as a constant, so $V_{G1}-V_{G2}=i_{bq}*(R1+R1)$. If $V_{in}$ is positive, T1 will increase the output current into the load RL. This means that $V_{GS1}$ will increase by some amount. So we let $V_{GS1}=V_Q+\Delta V_{GS1} V_{GS1}=V_Q+\Delta V_{GS1}$, where the added amount depends of un-linear parameters in the transistor. Equation 1 now becomes:

$$V_{out}=V_{in}+i_b*R1-V_{GS1}=V_{in}+i_b*R1-(V_Q+\Delta V_{GS1})V_{out}= V_{in}+i_b*R1-V_{GS1}=V_{in}+i_{bQ}*R1-V_{out}=V_{in}-\Delta V_{GS1} \qquad 3.$$

In a system according to an embodiment of the invention as illustrated in FIG. 1, as mentioned, the bias control loop will keep the idle current constant in the branch with the lowest current. Therefore, in this case, when T1 is driving the load, the control loop will increase $i_b$ until the desired idle current is obtained through T2.

To simplify we choose to omit the very small change in idle current coming from the change in $V_{SD2}$, so the current in T2 is only dependent of $V_{SG2}$. Then the gate-source voltage of T2 is unchanged $V_{SG2}=V_Q$. Equation 1 and 2 becomes:

$$V_{out}=V_{in}+i_b*R1-(V_Q+\Delta V_{GS1}) \qquad 4.$$

$$V_{out}=V_{in}-i_b*R1+((V_Q+0)) \qquad 5.$$

Adding two equations and dividing by two results in:

$$V_{out}=V_{in}-\Delta V_{GS1}/2 \qquad 6.$$

The same result appears when the investigation is made on a negative voltage input. Clearly, in an amplifier according to this embodiment of the invention, the non-linear component is reduced to half the value compared to a conventional system. If we substitute the MOSFET's with a complementary set of bipolar transistors we will find the same improvement in performance.

Figure 3:
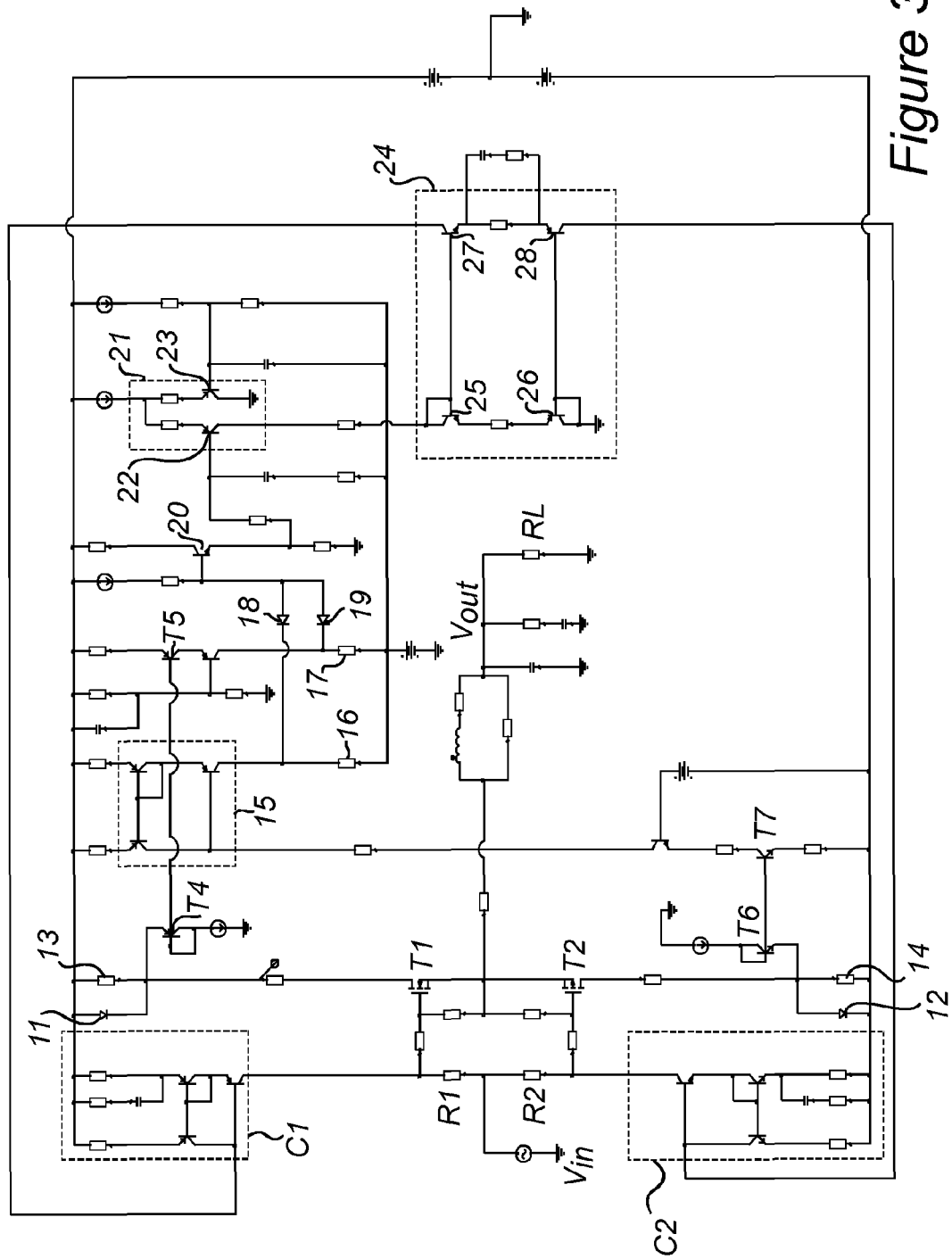
FIG. 3 is a more detailed circuit diagram of an amplifier of an embodiment of the invention.

FIG. 3 shows an example of a circuit realization of the schematic diagram in FIG. 1, with the processing circuitry 3 realized by analogue circuitry. Components in FIG. 3 corresponding to similar components in FIG. 1 have been given identical reference labels.

The output transistors T1, T2 are here MOSFET transistors, which are complementary to the common source $V_{in}$. The voltage drop across resistors R1 and R2 forms a bias voltage that generates gate-source voltages from the transistors. C1 and C2 are two current generators which track and input the same current as is drawn out so that the circuit is balanced.

The drain currents of T1 and T2 are measured by the following manner. A diode 11, 12 is provided in the forward direction of each drain. In parallel with the diode is a resistor 13, 14. The resistor 13, 14 has a value which ensures that the voltage drop across the resistor is determined by the desired bias current, and not by the forward voltage of the diode. For example, at 10 mA there will be a voltage of about 100 mV across resistor 13 which is significantly below the forward voltage of the diode. When the output draws a lot of current, the diode takes over and ensure that the output stage continues to function, only with a diode forward voltage less in the supply voltage.

The voltage drop across resistor 13 is detected by means of transistors T4, T5, and the value is supplied as a current. Similarly for the other branch, where transistors T6 and T7 detect the voltage across resistor 14. In the lower branch, the current signal is reversed by a current mirror 15. The voltage across resistor 16 now represents the current in the lower branch and the voltage across resistor 17 the current of the upper branch.

Using diodes 18 and 19 the lower of the two voltages is found, and this represents the value to be maintained as a constant according to the invention. This signal passes an emitter follower 20 to be subsequently low-pass filtered in order to introduce a loop filter to ensure that the feedback system is stable.

The filtered signal is connected to a differential amplifier 21 including transistors 22, 23. At the base of transistor 23 is provided a DC signal that corresponds to the desired minimum idle current, e.g. one Volt.

The differential amplifier 21 has its output connected to an amplifier 24 including transistors 25, 26, 27, 28. The amplifier is designed to convert the output current from the differential amplifier 21 to the two current generators C1, C2 that provide a voltage drop across R1 and R2.

The circuit also includes a number of RC components which aim to make the system fast and stable. There are also interposed some 1 mohm resistors which are irrelevant to the function. They only serve to provide a measure resistance in the simulation of the circuit.

Figure 4:
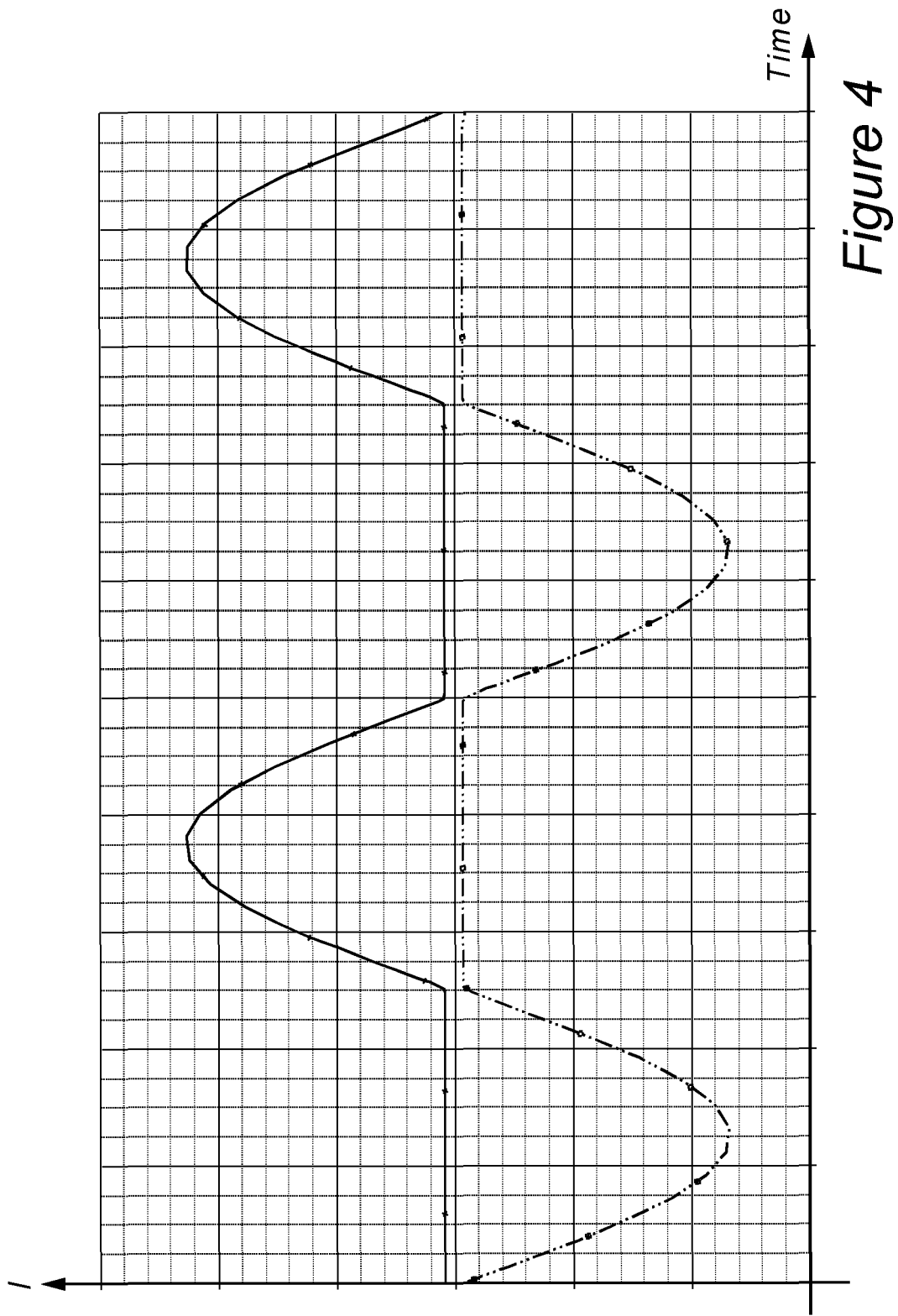
FIG. 4 is a diagram of output currents of the two branches in the circuit in FIG. 3.

FIG. 4 shows a simulation of the current in the circuit in FIG. 3, showing the current through the top and bottom transistors T1, T2. It is evident that both output transistors T1, T2 are constantly drawing current, and that a minimum flow of current is maintained at all times, in this case at around 8 mA.

The person skilled in the art realizes that the present invention by no means is limited to the preferred embodiments described above. On the contrary, many modifications and variations are possible within the scope of the appended claims. For example, the above description relates to an implementation with MOSFET transistors, but implementations with bipolar transistors are also possible. Further, the details of the circuit implementation may differ from that shown in FIG. 3, e.g. to include additional filters or feedback control.

The processing circuitry 3, which above has been exemplified with analogue circuitry, can also be implemented by a digital processor. Such implementation would entail suitable sampling, e.g. using 10 bit A/D and D/A converters with a sampling rate of 20 MHz. Possible embodiments include an SAR converter or a flash converter.

The invention claimed is:

1. An amplifier arrangement comprising:
   a first power amplifier having a drain connected to a positive drive voltage and a gate connected to an input signal,
   a second power amplifier having a drain connected to a negative drive voltage and a gate connected to said input signal,
   wherein a source of the first power amplifier and a source of the second power amplifier are both connected to a load (RL),
   a first current sensor detecting a first drain current from said first power amplifier,
   a second current sensor detecting a second drain current from said second power amplifier,
   processing circuitry adapted to identify an idle current as a smallest drain current of said first and second drain currents,
   a bias control loop including:
      a comparator arranged to compare said idle current with a pre-set idle current set point, to provide an error signal, and
      a loop gain providing a feedback signal based on said error signal,
   a first current source connected to drive a bias current dependent on said feedback signal through a first resistor connected between the input signal and the gate of the first power amplifier to create a first bias voltage at the gate of said first power amplifier, in order to ensure that the first drain current from said first power amplifier is equal to the pre-set idle current when said first power amplifier is inactive, and
   a second current source connected to drive a bias current dependent on said feedback signal through a second resistor connected between the input signal and the gate of the second power amplifier to create a second bias voltage at the gate of said second power amplifier in order to ensure that the second drain current from said second power amplifier is equal to the pre-set idle current when said second power amplifier is inactive.

2. The arrangement according to claim 1, wherein each of said first current source and said second current source is configured to, if said first drain current or said second drain current is smaller the pre-set idle current, increase the bias current through said first resistor or said second resistor, respectively, until said first drain current or said second drain current becomes equal to the pre-set idle current.

3. The arrangement according to claim 1, wherein said processing circuitry is realized as an analogue circuit.

4. The arrangement according to claim 1, wherein said processing circuitry comprises a digital processor.

5. A method for controlling an idle current in an amplifier arrangement having a first and a second power amplifier, a positive drive voltage connected to a drain of said first power amplifier, a negative drive voltage connected to a drain of said second power amplifier, and an input signal connected to a gate of each power amplifiers, and wherein a source of the first power amplifier and a source of the second power amplifier are both connected to a load (RL), said method comprising:
   detecting a first drain current from said first power amplifier,
   detecting a second drain current from said second power amplifier,
   identifying an idle current as a smallest drain current of said first and second drain currents,
   comparing said idle current with a pre-set idle current set point, to provide an error signal,
   supplying said error signal to a loop gain, to provide a feedback signal,
   supplying said feedback signal
      to a first current source connected to drive a current through a first resistor to create a first bias voltage at a gate of said first power amplifier, and
      to a second current source connected to drive a current through a second resistor to create a second bias voltage at a gate of said second power amplifier, driving a bias current dependent on said feedback signal through one of said first resistor or said second resistor connected between the input signal and the gate of an inactive one of said first and second power amplifiers, thereby ensuring that a drain current from said inactive power amplifier is equal to said pre-set idle current.

6. The method according to claim 5, wherein said step of driving a bias current includes if said first drain current or said second drain current is smaller the pre-set idle current, increasing the bias current through said first resistor or said second resistor, respectively, until said first drain current or said second drain current becomes equal to the pre-set idle current.

* * * * *

UNITED STATES PATENT AND TRADEMARK OFFICE
CERTIFICATE OF CORRECTION

PATENT NO. : 9,899,964 B2  
APPLICATION NO. : 15/312342  
DATED : February 20, 2018  
INVENTOR(S) : Jorgen Selmer Jensen et al.

Page 1 of 1

It is certified that error appears in the above-identified patent and that said Letters Patent is hereby corrected as shown below:

In the Specification

At Column 4, Line 2, change "$V_{GS1} = V_{GS2}$" to "$V_{GS1} = V_{SG2}$"

At Column 4, Line 8, change "$V_{out}=V_{in}-i_b*R1+V_{GS2}V_{out}=*V_{in}-i_b*R1+V_{SG2}$," to "$V_{out}=V_{in}-i_b*R1+V_{SG2}$,"

At Column 4, Line 11, change "$V_{GS}=V_{GS1}=V_Q=1_{bq}*R1$," to "$V_{GS1}=V_{SG2}=V_Q=i_{bq}*R1$,"

At Column 4, Lines 19-20, change "$V_{GS1}= V_Q+\Delta V_{GS1}V_{GS1}=V_Q+ \Delta V_{GS1}$," to "$V_{GS1}= V_Q+\Delta V_{GS1}$,"

At Column 4, Lines 22-23, change "$V_{out}=V_{in}+i_b*R1-V_{GS1}=V_{in}+i_b*R1-(V_Q+\Delta V_{GS1})V_{out}=V_{in}+i_b*R1-V_{GS1}=V_{in}+i_{bQ}*R1-V_{out}=V_{in}-\Delta V_{GS1}$" to "$V_{out}=V_{in}+i_b*R1-V_{GS1}=V_{in}+i_{bq}*R1-(V_Q+\Delta V_{GS1})$"

At Column 4, Line 38, change "$V_{out}=V_{in}-i_b*R1((V_Q +0)$" to "$V_{out}=V_{in}-i_b*R1(V_Q +0)$"

Signed and Sealed this  
Eleventh Day of December, 2018

Andrei Iancu  
*Director of the United States Patent and Trademark Office*